United States Patent
Howes et al.

(10) Patent No.: US 8,305,760 B2
(45) Date of Patent: Nov. 6, 2012

(54) MODULAR HIGH-POWER DRIVE STACK COOLED WITH VAPORIZABLE DIELECTRIC FLUID

(75) Inventors: Jeremy Charles Howes, Charlotte, NC (US); David Levett, Charlotte, NC (US)

(73) Assignee: Parker-Hannifin Corporation, Cleveland, OH (US)

(*) Notice: Subject to any disclaimer, the term of this patent is extended or adjusted under 35 U.S.C. 154(b) by 43 days.

(21) Appl. No.: 12/921,238

(22) PCT Filed: May 18, 2009

(86) PCT No.: PCT/US2009/044311
§ 371 (c)(1),
(2), (4) Date: Sep. 7, 2010

(87) PCT Pub. No.: WO2009/140672
PCT Pub. Date: Nov. 19, 2009

(65) Prior Publication Data
US 2011/0013364 A1    Jan. 20, 2011

Related U.S. Application Data

(60) Provisional application No. 61/053,686, filed on May 16, 2008.

(51) Int. Cl.
*H05K 7/20* (2006.01)
(52) U.S. Cl. ........ 361/717; 361/677; 361/689; 361/699; 361/702; 439/196; 439/207; 174/15.1
(58) Field of Classification Search .............. 361/676, 361/688, 689, 696–720
See application file for complete search history.

(56) References Cited

U.S. PATENT DOCUMENTS

| | | | |
|---|---|---|---|
| 2,578,415 A | 12/1951 | Franklin | |
| 3,065,438 A | 11/1962 | Anderson | |
| 3,133,145 A | 5/1964 | Bahn | |
| 3,333,044 A | 7/1967 | Toto | |
| 3,524,497 A | 8/1970 | Chu et al. | |
| 3,801,724 A | 4/1974 | Goodman | |
| 3,913,956 A | 10/1975 | Eidelberg et al. | |
| 4,005,297 A * | 1/1977 | Cleaveland | 218/118 |
| 4,733,331 A | 3/1988 | Chauvet | |
| 4,992,623 A | 2/1991 | Briley et al. | |
| 5,132,777 A | 7/1992 | Kloucek | |
| 5,177,666 A | 1/1993 | Bland et al. | |
| 5,260,850 A | 11/1993 | Sherwood et al. | |
| 5,461,215 A | 10/1995 | Haldeman | |
| 5,573,414 A | 11/1996 | Taillon et al. | |
| 5,616,040 A | 4/1997 | Taillon et al. | |
| 5,791,924 A | 8/1998 | Taillon et al. | |
| 6,125,650 A * | 10/2000 | Pfister et al. | 62/480 |
| 6,471,530 B1 | 10/2002 | Gimbatti et al. | |

(Continued)

FOREIGN PATENT DOCUMENTS
EP    1524888    4/2005
(Continued)

*Primary Examiner* — Courtney Smith
(74) *Attorney, Agent, or Firm* — Robert J. Clark

(57) ABSTRACT

A high power drive stack system is provided which includes a cabinet (20) having a vaporizable dielectric fluid cooling system (110) and a plurality of receivers (22) for accepting a plurality of modules (30) containing power electronics. The modules are removably attachable to the receivers by at least two non-latching, dry-break connectors (210). Each of the at least two connectors providing both a fluid connection and an electrical connection between the cabinet and the module.

13 Claims, 8 Drawing Sheets

U.S. PATENT DOCUMENTS

| | | |
|---|---|---|
| 6,508,301 B2 | 1/2003 | Marsala |
| 6,679,081 B2 | 1/2004 | Marsala |
| 6,979,843 B2 | 12/2005 | Nakajima et al. |
| 6,992,409 B2 | 1/2006 | Torii et al. |
| 7,258,161 B2 | 8/2007 | Cosley et al. |
| 7,450,388 B2 * | 11/2008 | Beihoff et al. ............... 361/715 |
| 7,864,532 B1 * | 1/2011 | Ehret et al. .................... 361/713 |
| 8,094,435 B2 * | 1/2012 | Howes et al. ................. 361/614 |
| 2002/0070702 A1 * | 6/2002 | Ragnarsson ................. 320/101 |
| 2004/0008483 A1 | 1/2004 | Cheon |
| 2007/0034360 A1 | 2/2007 | Hall |
| 2007/0177352 A1 * | 8/2007 | Monfarad et al. ............ 361/699 |
| 2007/0248934 A1 | 10/2007 | Mosimann |
| 2007/0269999 A1 * | 11/2007 | Di Stefano ...................... 439/73 |
| 2008/0085620 A1 * | 4/2008 | Wood ............................ 439/178 |

FOREIGN PATENT DOCUMENTS

| | | |
|---|---|---|
| WO | 7901012 A1 | 11/1979 |

* cited by examiner

MODULAR HIGH-POWER DRIVE STACK COOLED WITH VAPORIZABLE DIELECTRIC FLUID

CROSS-REFERENCE TO RELATED CASES

This application claims the benefit of U.S. Provisional Application Ser. No. 61/053,686; filed May 16, 2008, the disclosure of which is expressly incorporated herein by reference.

TECHNICAL FIELD

The invention herein described relates to fluid cooled power electronic modules that can be connected together to form a variety of configurations of power electronic alternating current (AC) or direct current (DC) motor drive stacks, and more generally to a system and method for a modular motor drive stack and/or uninterruptible power supplies that are pluggable and scalable for use in a variety of applications and wherein the pluggable connections provide a connection for both power and coolant.

BACKGROUND

Electrical and electronic components (e.g. microprocessors, IGBT's, power semiconductors etc.) are most often cooled by air-cooled heat sinks with extended surfaces, directly attached to the surface to be cooled. A fan or blower moves air across the heat sink fins, removing the heat generated by the component. With increasing power densities, miniaturization of components, and shrinking of packaging, it is sometimes not possible to adequately cool electrical and electronic components with heat sinks and forced air flows. When this occurs, other methods must be employed to remove heat from the components.

A particular cooling problem example is with high power drive stacks. High-power drive stacks are used in a wide variety of applications. Such applications include for example, driving a motor, regenerating energy from a windmill or other renewable power source back to a distribution line, braking systems for large inertia objects (e.g., large wheel), etc. A conventional high power drive stack is a monolithic unit that typically includes electronic controls, power components, and cooling components. The power components generally include an input rectifier, IGBT bridge module, and a dynamic brake switch. The power components are generally coupled to the cooling components, which may include a heat sink and/or a cooling fan. A variation in the monolithic design, discussed above, is to divide the high-power drive stack into several different units. In such case, the drive may be divided into three separate units (e.g., input rectifier unit, brake unit and inverter unit). The units may be connected together by cables and/or bus bars, and are mounted in separate enclosures. A further refinement to the above prior art systems is to provide a drive that is divided up into different units, with the drives consisting of two common electric connection points (e.g., DC+ and DC−). In addition, such units may also provide that these connection points align mechanically, which enables the units to be modular and connect together using two straight bus bars, when a plurality of drive units are connected together.

In addition to adequate cooling problems, there are a variety of other drawbacks associated with such prior art devices. For example, there are only two common electrical connection points. All other connections generally have to be made by hard wiring the connection directly to the device. Many such devices are not pluggable and/or removably insertable, which makes removing, repairing, and installing the device difficult and time consuming.

SUMMARY OF THE INVENTION

At least one advantage is provided by a high power drive stack system comprising: a common support structure including: a system power source, a dielectric fluid cooling system, and a plurality of receivers located in predetermined locations, wherein at least one of the receivers has at least two receiver connectors and the at least two receiver connectors have a predetermined position in one of the receivers; at least one module including: a power component, a dielectric fluid cooling circuit associated with the power component, and at least two module connectors, wherein the at least two module connectors are arranged in a predetermined position and electrically coupled to at least a portion of the power component and fluidly coupled to the dielectric fluid cooling circuit associated with the power component; and each module connector mating with a corresponding receiver connector to form an electrical connection and a fluid connection between the module and the common support structure.

At least one advantage is provided by a cooling and power system comprising: a vaporizable dielectric fluid cooling system having an evaporator positioned to cool at least one power silicon device, at least portions of a fluid conduit of the vaporizable dielectric fluid cooling system also providing an electrical connection to the power silicon device.

At least one advantage is provided by a connector comprising: a plug and mating socket, the plug and socket are formed at least in part as a hollow tube, at least a portion of the tube being conductive along its length, the plug and socket constructed to make an electrical connection between the plug and socket; the plug and socket constructed to make a fluid connection between the plug and socket.

At least one advantage is provided by a method of cooling and powering a silicon device comprising the steps of: providing a power silicon device cooling the power silicon device by providing a cooling system utilizing a vaporizable dielectric refrigerant, the system comprising a plurality of fluid conduits, a pump, a condenser, and an evaporator, wherein the evaporator is positioned for cooling the power silicon device; providing a source of power; powering the silicon device by electrically connecting the source of power to the power silicon device utilizing at least a portion of the fluid conduit.

Further features of the invention will become apparent from the following detailed description when considered in conjunction with the drawings. In addition, while a particular feature of the invention may have been described above with respect to only one or more of several illustrated embodiments, such feature may be combined with one or more other features of the other embodiments, as may be desired and advantageous for any given or particular application.

BRIEF DESCRIPTION OF THE DRAWINGS

Embodiments of this invention will now be described in further detail with reference to the accompanying drawings, in which.

DETAILED DESCRIPTION

Figure 1:
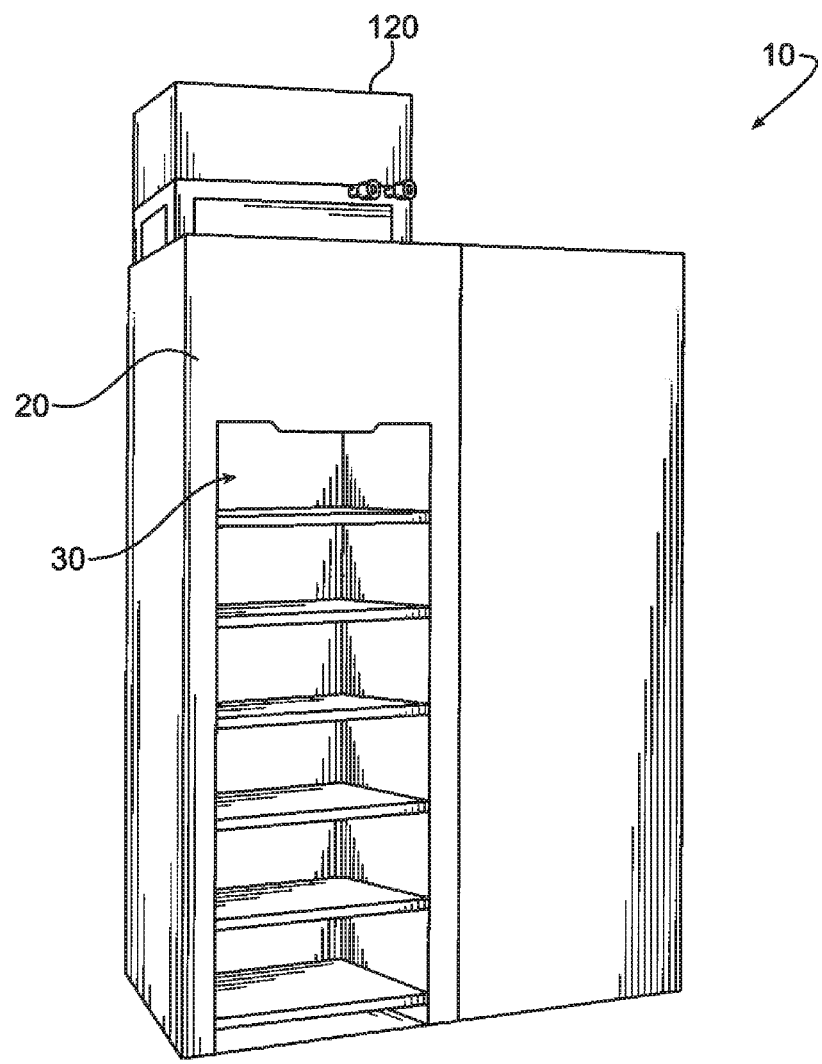
FIG. 1 is a perspective view of an exemplary high power electronic stack system in accordance with aspects of the invention.

One aspect of the present invention is to provide an apparatus and method of cooling and powering a silicon device, such as those in a modular, high-power drive stack, by providing a cooling system utilizing a vaporizable dielectric refrigerant and utilizing at least a portion of the cooling system to also provide an electrical connection to a source of power in a manner that the modules can be simply inserted and removed from a cabinet as needed without requiring extensive assembly and disassembly of the modules or connection devices. An embodiment of a such a modular, high-power drive stack 10 is shown in FIG. 1. As used herein, the phrase "high power" means a circuit having a voltage of more than 50 V AC or 120 V DC or a current above 50 Amps. The drive stack 10 comprises a common support structure 20 or rack, herein shown as a cabinet, which houses a plurality of modules 30 which slide into receivers (not shown) of the cabinet 20. The cabinet 20 can be fabricated from steel or aluminum (or any other suitable material) and may optionally include parallel vertical rails or rack rails for storing one or more modules 30. The cabinet 20 may also be secured to a floor, wall and/or ceiling for additional support. As one of ordinary skill in the art will readily appreciate any suitable rack for supporting electronic equipment thereon may be used in accordance with the present invention. In addition, while the cabinet 20 is illustrated for stacking modules 30 in a vertical orientation, it will be readily appreciate that a suitable common support structure 20 may also be suitable for storing the components in a horizontal orientation. The drive stack 10 further includes a cooling system 110 of which the condenser 120 is shown attached at the top of the drive stack 10.

Figure 2:
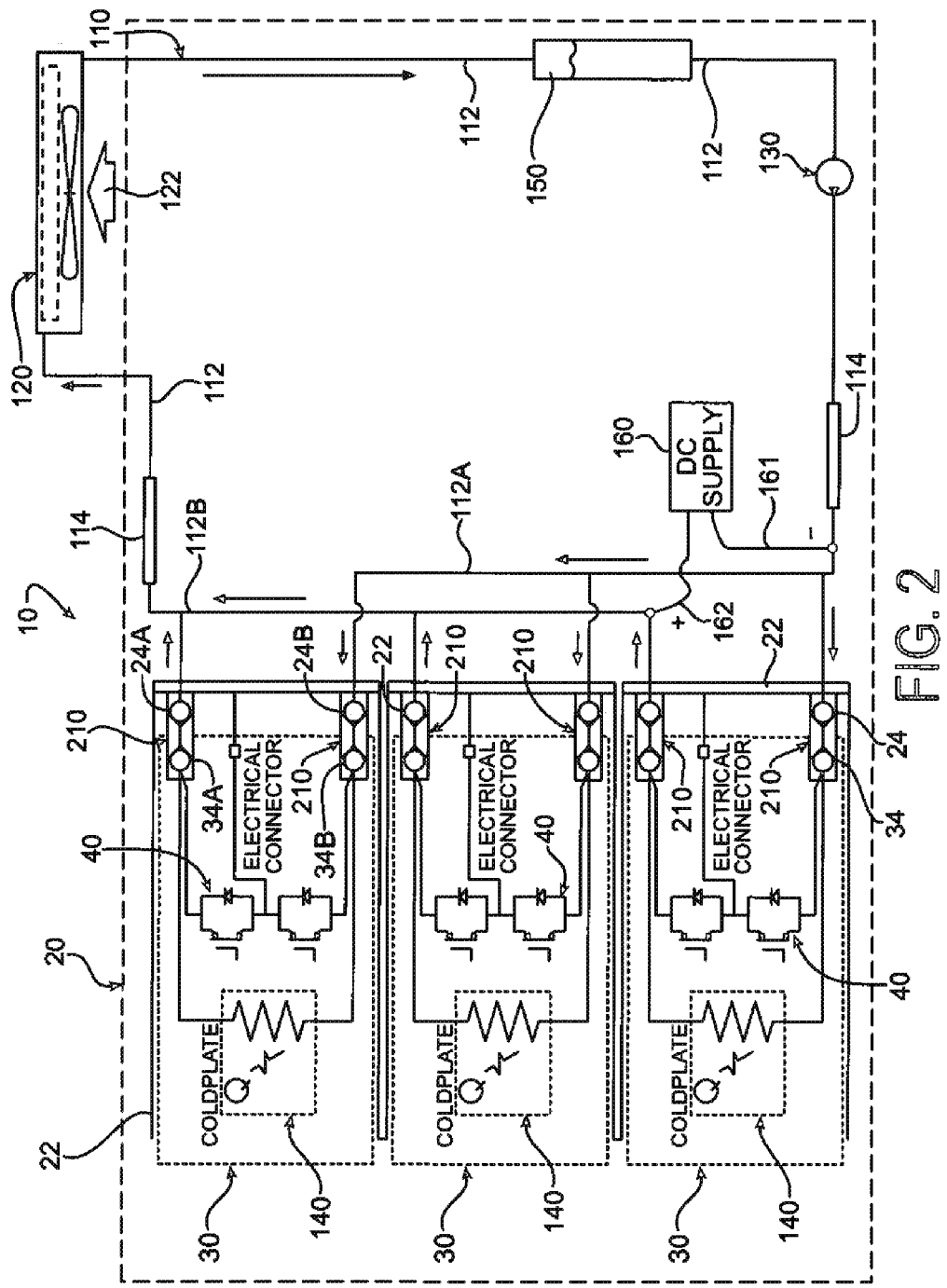
FIG. 2 is a schematic view of an exemplary high power electronic stack system in accordance with aspects of the invention.

A schematic of an embodiment of the high-power drive stack 10 is shown in FIG. 2. Cabinet 20 surrounds a dielectric fluid cooling system 110 and a plurality of modules 30. The dielectric fluid cooling system 110 comprises a plurality of fluid conduits 112, a condenser 120 (attached to the top of the cabinet 20 in a manner allowing ambient air 122 to pass through the condenser 120), a pump 130, and a cold plate evaporator 140 or other heat exchanger, the cold plate 140 is mounted on a module 30 and positioned to cool a power component 40, shown herein as a pair of IGBTs, by cooling a heat sink near the power component 40 or by allowing direct contact of a dielectric fluid with the power component 40. The dielectric fluid cooling system 110 may further comprise other components such as a fluid reservoir or liquid receiver 150 between the condenser 120 and the pump 130, or a vapor separator (not shown) before the inlet to the condenser 120, or a filter (not shown), or other devices as appropriate. In one embodiment of the invention the dielectric fluid cooling system 110 utilizes a vaporizable dielectric refrigerant. The refrigerant is pumped through the dielectric fluid cooling system 110 by pump 130 in the direction shown by arrows adjacent the fluid conduits 112 on FIG. 2. In addition to providing a dielectric fluid passage, fluid conduits 112A and 112B are electrically connected by wires 161 and 162 to a system DC power source such that fluid conduit 112A is a DC− bus and fluid conduit 112B is a DC+ bus. The DC− bus 112A and DC+ bus 112B are electrically isolated from the portion of the dielectric fluid cooling system 110 that includes condenser 120 and pump 130 by non-conductive tubular isolators 114.

The module 30 slides into one of a plurality of receivers 22 positioned in a predetermined position in the cabinet 20. The receiver 22 has at least two receiver connectors 24A, 24B positioned in a predetermined position. One of the receiver connectors 24A is fluidly and electrically connected to a supply of dielectric fluid through supply conduit and DC− bus 112A while another receiver connector 24B is attached to is fluidly and electrically connected to a return line for dielectric fluid through return conduit and DC+ bus 112B. The module 30 has at least two module connectors 34A, 34B positioned in a predetermined position such that the receiver connectors 24A, 24B engage the module connectors 34A, 34B, respectively, making a fluid connection and an electrical connection 210 between the cabinet 20 and the module 30. In one embodiment of the invention the fluid and electrical connection 210 is connected and disconnected merely by moving the module 30 into and out or the receiver 22 wherein the connection 210 is a dry-break connection and a non-latching connection. The module 30 may be secured to the receiver 22 or other portion of the cabinet 20 when the module 30 is fully inserted into the receiver 22 in order to secure the module 30 in the cabinet 20 and to maintain connection 210.

Each module 30 is highly configurable to have a variety of circuitry that utilizes a power component 40 from one or more of the modules 30 to perform a high power function to used to build a complete AC and/or DC drive stack. The drive stack can then be used in conjunction with a controller (not shown) to adjust the torque and speed of an AC/DC electric motor. The modules 30 can be plugged together like building blocks to form a large variety of AC/DC drive stacks that can be tailored to meet an exact system requirement. Examples of such configurations are shown in commonly owned U.S. patent application Ser. No. 11/743,735, filed May 3, 2007 and herein incorporated by reference.

Figure 3:
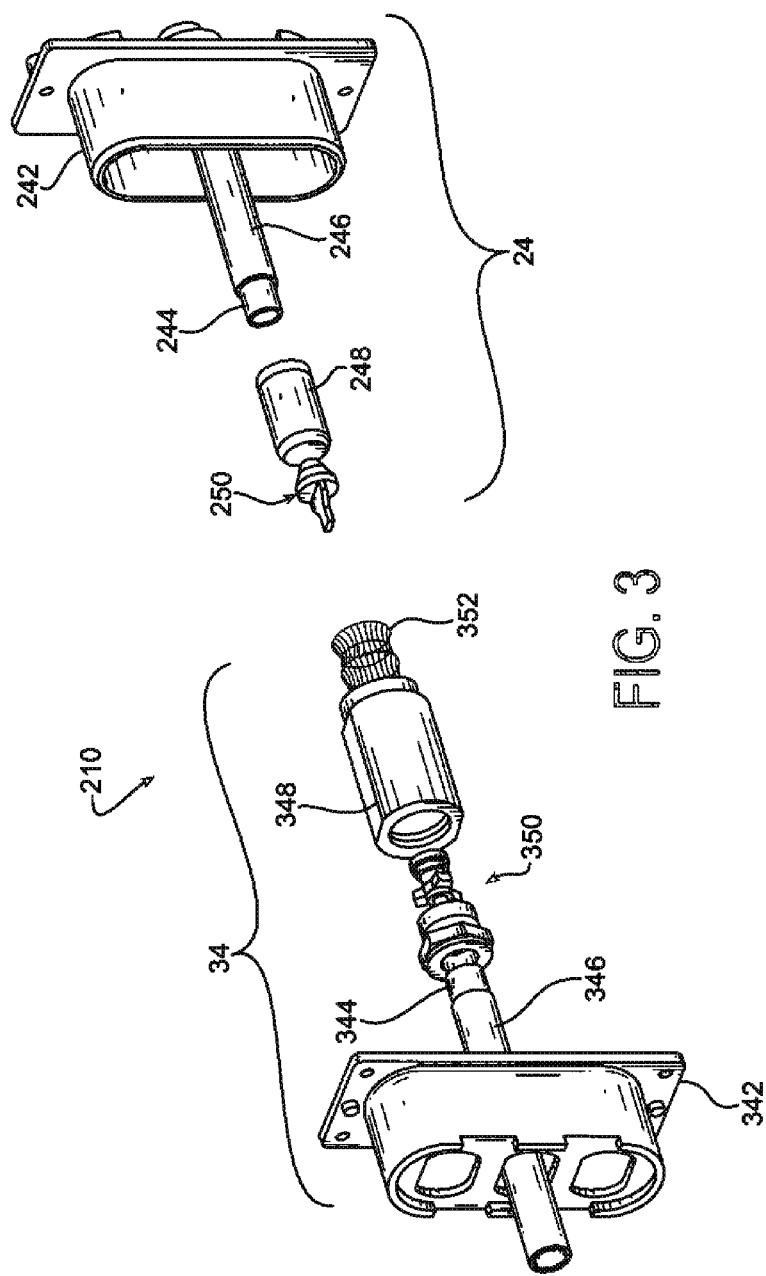
FIG. 3 shows a perspective exploded view of a combined electrical and cooling fluid connector.
Figure 4:
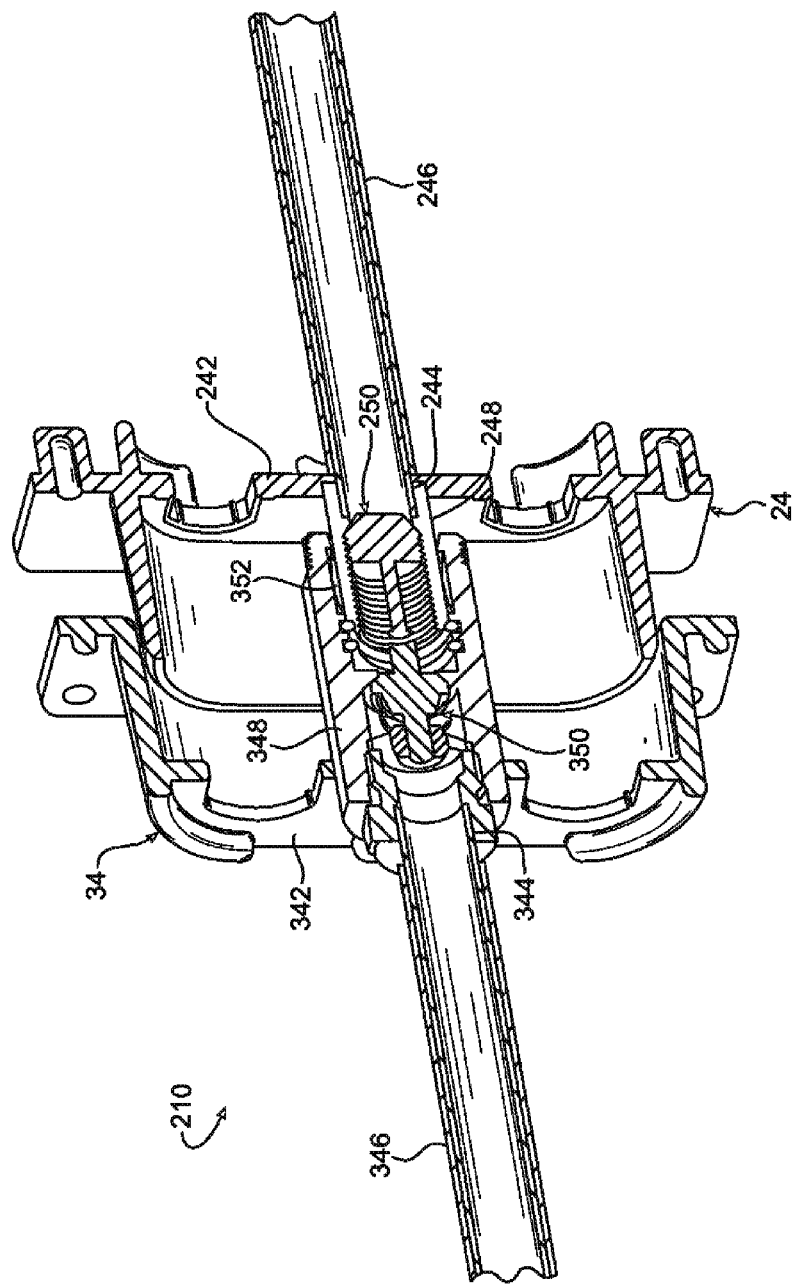
FIG. 4 shows a perspective cross-sectional view of the connector of FIG. 3.

An embodiment of the connection 210 is shown in FIGS. 3 and 4. Connection 210 comprises receiver connector 24 and module connector 34. Receiver connector 34 comprises an insulated female support 342 which can house up to three connectors. A copper pipe 344 is insulated with an appropriate insulating material 346 and is positioned through the support 342. The module connector 34 further comprises a conductive female coupling/contact body 348 which houses a poppet seal assembly 350 and an annular electrical conductive contact member 352. An exposed portion of the copper pipe 344 contacts a conductive portion of the poppet seal assembly 350 which is conductively coupled to conductive female coupling/contact body 348 which is conductively coupled to the annular electrical conductive contact member 352. The receiver connector 24 comprises an insulated male support 242 which can house up to three connectors. A copper pipe 244 is insulated with an appropriate insulating material 246 and is positioned through the support 242. The receiver connector 24 further comprises a conductive male coupling/contact body 248 which houses a valve core seal assembly 250. An exposed portion of the copper pipe 244 contacts the conductive male coupling/contact body 248.

As shown in FIG. 4, the male coupling/contact body 248 is inserted into the female coupling/contact body 348 and engages the annular electrical conductive contact member 352 thereby providing an electrical connection through the connection 210. The connection 210 also provides a non-latching, dry-break fluid connection. The poppet seal assembly 350 prevents fluid flow through the module connector 34 when the module 30 is not positioned in receiver 20. Likewise, valve core seal assembly 250 prevents fluid flow through the receiver connector 24 when the module 30 is not positioned in receiver 20. When the module 30 is positioned in receiver 20 creating connection 210, the valve core seal assembly is engaged by the valve core assembly, opening a fluid connection across the connection 210. The combination fluid and electrical connection 210 provides cooling for the high current connector and reduces the size and number of interconnects required for a module 30. While the receiver and module components have been described in terms of male and/or female connections, one of ordinary skill in the art will readily appreciate the connections may be interchangeable, i.e., the connectors may be interchangeable. The embodiment shown is merely one of many possible connections and the present invention is not limited to the configuration of the connection shown. This concept could also include a flexible connector or hose with this pluggable combination connector at both ends to carry both high current and coolant between devices that use both. For example between a battery power pack and motor drive or UPS.

The above discussion is focused on the system 10. However, the introduction of the combined electrical and fluid connection provides additional advantages in the modules 30 and power components 40 in general. Focusing now on the powered components 40 of the modules 30, if a heatsink is used to carry both the coolant and current to and from the power silicon devices 40 it provides an opportunity to improve the packaging and cooling of power semiconductor devices 40. There are several areas of conventional power semi-conductor devices that this type of vapor dielectric fluid system could potentially improve.

One potential area of improvement is a typical power silicon module. The two barriers that make up the bulk of the thermal impedance between the silicon die and the heatsink are the insulator between the live silicon device and the base-plate and then the mechanical joint between the base-plate and the heatsink. Placing the silicon die can be placed directly on a live heatsink, the total thermal impedance can be significantly reduced.

Another area of potential improvement is in applications which have high cyclic loads. The difference in the coefficient of thermal expansion between the different materials will cause mechanical stress in the device and over a long time period cause degradation and eventual failure. Due to the phase change in the vaporizable dielectric cooling fluid within the cold plate, changes in base-plate temperature caused by heat load changes in the power module are minimized. In addition, if the power silicon die were bonded directly to a live heatsink, the number of mechanical interfaces between the silicon and its base plate can be reduced. Finally, if the heatsink is made with a material such a ALSiC, which has improved mechanical properties over copper for long term stability, more and higher temperature cycles can be applied before mechanical failure.

Still another area of potential improvement is with the use of the heatsink(s) as current conductors. This use allows the number of mechanical interconnects to the power semiconductor devices and the number of bond wires to be reduced.

Another area of potential improvement relates to when power semiconductor devices switch the rate of change of voltage will induce currents to any local ground/earth plane via capacitive coupling. These high frequency currents are not desirable because they may cause electromagnetic interference into nearby electronic systems, for example communications devices or computers. Modules with an earthed baseplate typically generate a large amount of current due to the close proximity and large surface area of the module base-plate at ground potential shared with the switching devices. The ability of the coolant to operate at a floating electric potential with respect to earth can reduce capacitively coupled high frequency switching currents flowing to earth or the mounting chassis of equipment that is referenced to earth, for example the frame of a hybrid vehicle or aircraft. This reduces EMC emissions.

It is also noted that the coolant has no ions to carry charge eliminating the possibility of leakage currents flowing in the coolant which can cause circuit failure, additional heating and electro-chemical corrosion of connections.

When a power device switches there is a very high rate of change of current between the devices and their supply or snubber capacitors. If there is any inductance in this current path it causes a voltage spike across the semiconductor device which can cause failure. Mounting the device on a live heatsink enables this inductance to be reduced. This is achieved by employing a parallel plate construction that cancels out opposing magnetic fields generated by the current flow.

Pumped refrigerant is well suited to cooling bus bars and devices that operate at a high electric potential with respect to earth as it is an effective dielectric. This allows the same fluid circuit to cool numerous devices in series that are operating at different electrical potentials. Also due to the phase change nature of the system the coolant has a very small change in boiling temperature as it passes through the series heatsinks which enables multiple devices to be kept at the same operating temperature. It is also safe as a coolant leak will not cause electrical breakdown across any high voltage insulating barriers.

Power semiconductor packaging falls into three main groups. 1) Discrete devices are low power molded plastic packages for pcb mounting with either isolated or non isolated mounting plates. 2) Modules are medium power devices with single sided silicon mounting and bond wire construction. The devices are mounted on an isolated baseplate and enclosed in a plastic housing. 3) Disc or capsule devices are for high power applications and use a double sided disk construction with non isolated faceplates clamped together to provide good thermal and electrical conductivity. Methods of applying vaporizable dielectric cooling to each package type will be shown that provide many of the advantages as listed above that can be applied.

Figure 5:
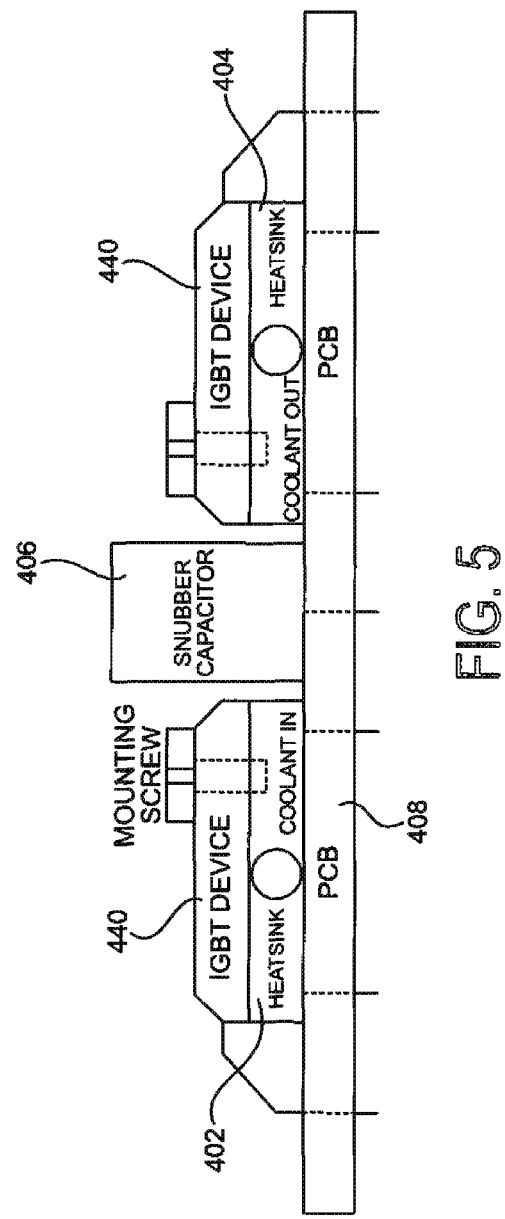
FIG. 5 is a side view of a PCB assembly using TO-247 devices.

Discrete devices. A cold plates is used in conjunction with pcb mounted live case components such a TO-247 packages where the entire power assembly including heatsinks is wave soldered for a very cost effective power module as shown in FIG. 5. The cold plate heatsinks 402, 404 are shown with an attached IGBT devices 440 with a fluid path coming into heat sink 402 and exiting heatsink 404 with a snubber capacitor 406 mounted between the devices which are all soldered to the PCB 408. The assembly can be very compact and derive many of the advantages listed above.

Figure 6:
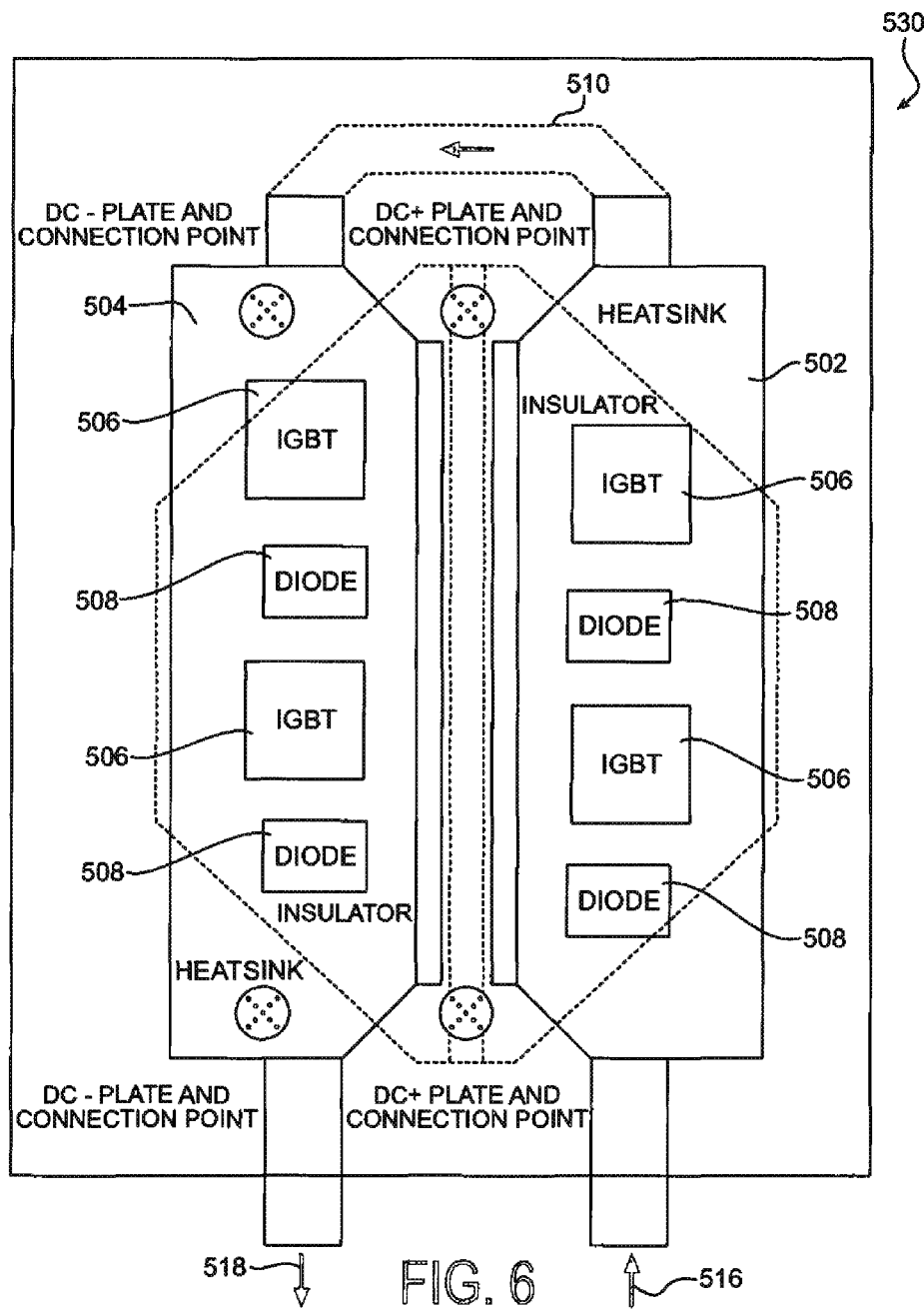
FIG. 6 is a top view of a dual module layout using silicon die bonded directly to live cold plates.

Modules. In typical construction of these devices, the silicon die are soldered to an insulator which is in turn soldered to a copper base plate. Electrical connections between devices are made either by copper strips on the insulator or by bond wires. FIG. 6 shows a module layout 530 and design using vaporizable dielectric fluid based heatsinks 512. This layout 530 is for a typical dual IGBT module with corresponding fly-back diodes. The assembly uses two heatsinks 502, 504 operating at the potential of the attached IGBT 506 and diode devices 508. Fluid enters the heatsink 502 as shown at arrow 516 and exits as shown at arrow 518. This allows for a very compact module and can derive many of the benefits listed above. It can be seen that the parallel plate construction and location of the power connection points provides a very low inductance path to the snubber capacitors. It is noted that the pipe between the heatsinks 502 and 504 is electrically isolated as shown at 510.

Figure 9:
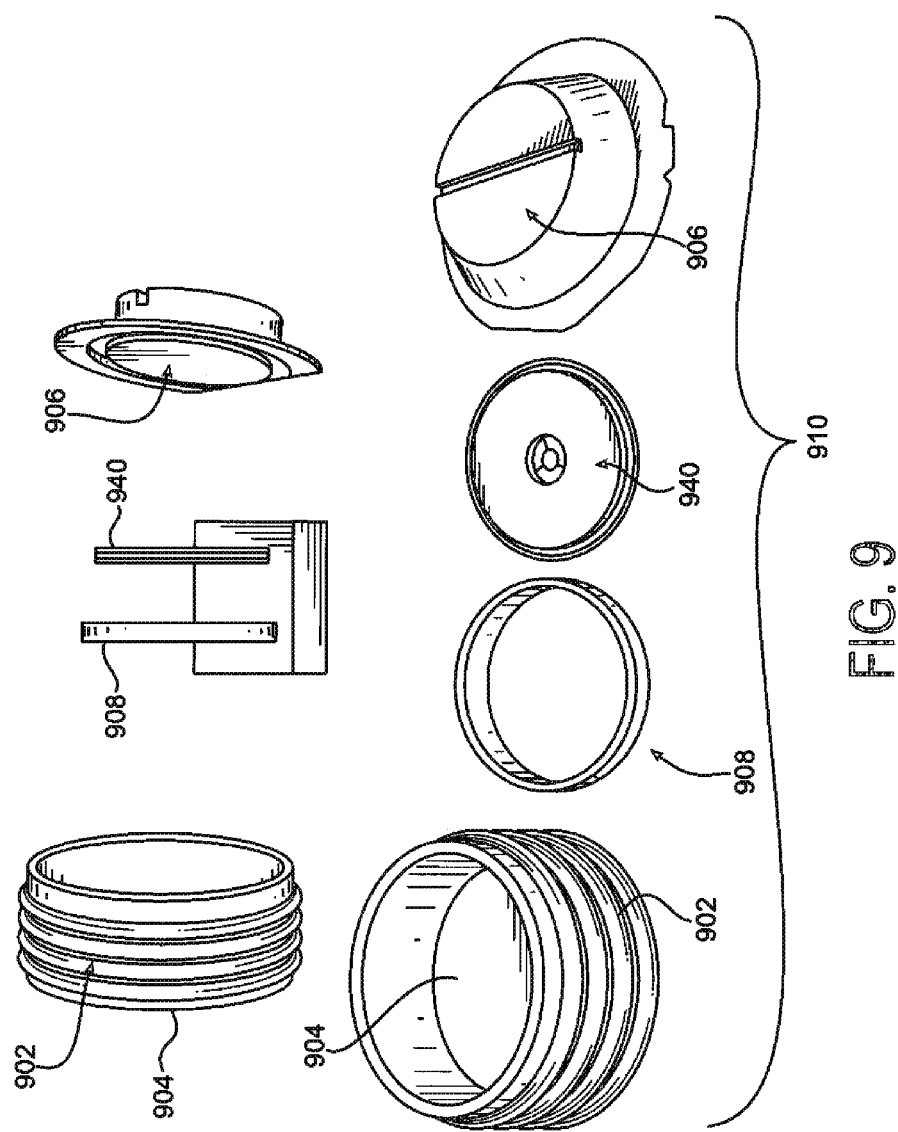
FIG. 9 shows a typical disc type semiconductor packaging.

Disk or puck style devices. There are several potential advantages in applying this cooling system to disk style devices. Typical construction of a disc style device is shown in FIG. 9. The semiconductor disk 940 and ring insulator 908 are placed within an outer sealed case 902 and clamped between two copper disks 904, 906 which transfer heat and current to the outer faces of the device. The assembled device 910 (not shown as assembled) is encapsulated and filled with an inert gas. Heatsinks are then mounted either side of the capsule and a special clamp mechanism is employed to provide correct and even force to the assembly to ensure good heat and current transfer.

Figure 7:
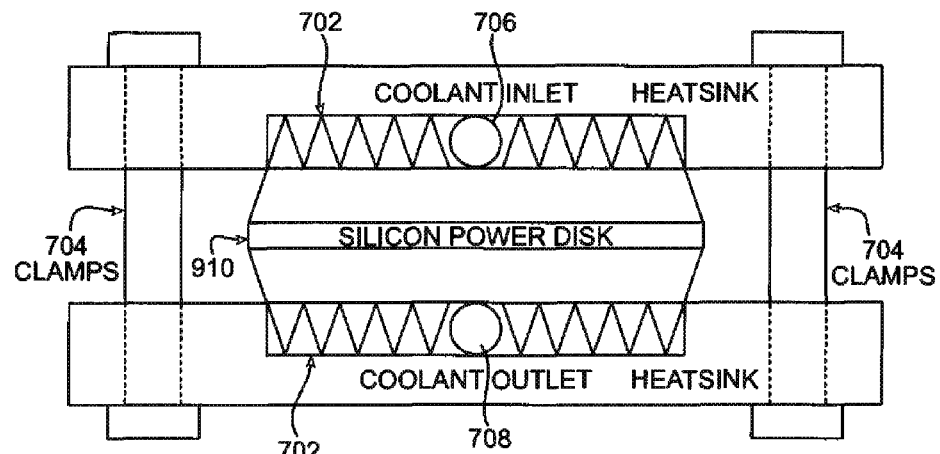
FIG. 7 shows a representation of vaporizable dielectric cooling used with a disk or puck.

In one embodiment as shown in FIG. 7, vaporizable dielectric fluid cold plates 702 are positioned on either side of the device 910 and clamped together by clamps 704. Coolant fluid enters the coldplate heatsink at 706 and exits at 708. This configuration provides several advantages over traditional air cooling in terms of size and weight. Also as the faces of the device are at a high electrical potential, water can only be used as a coolant if it is very pure and ion free. In this state water can be corrosive. A dielectric coolant is by it's nature ion free and is non-corrosive. This allows for a very compact module and can derive several benefits listed above.

Figure 8:
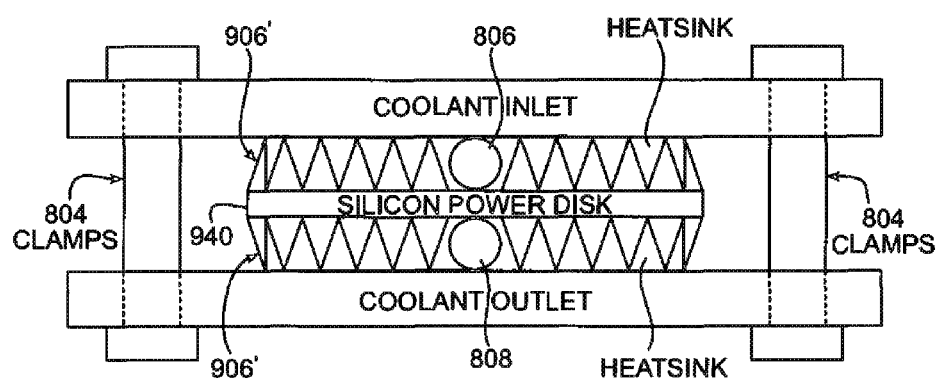
FIG. 8 shows another representation of vaporizable dielectric cooling used with a disk or puck.

In another embodiment as shown in FIG. 8, refrigerant flows at 806 and 808 directly into and out of the supporting copper disks 906' shown as the heatsinks which surround the silicon power disk 940 and are clamped together by clamp 804. The cooling pipes could be used to carry both the current and coolant to and from the device 940. This would eliminate two thermal and current interfaces and the size of the assembly could be reduced. However it would not eliminate the need for the clamping mechanism. This allows for a very compact module.

In another embodiment, the refrigerant is positioned in direct contact with the surface of the semiconductor disk and the clamp mechanism could be eliminated. U.S. Pat. No. 5,132,777, hereby incorporated by reference, describes a system of connecting the semiconductor disk to the current carrying members of the device using small soldered contact filaments. This avoids the problem of connecting two materials which have different coefficients of thermal expansion. Cold plates can be bonded directly to both sides of the disk. The idea of connection for a disk type module can be combined with the concept presented here of using vaporizable dielectric cooling and using the coolant connections to also carry current to and from the module to design a device that which would eliminate four thermal and current interfaces compared to traditional packaging solution and the need for the expensive and error prone clamping system.

Although shown primarily for a high-power drive stack, the aspects of the present invention include other possible applications. A possible application for this concept would be for hybrid electric vehicles. The vaporizable dielectric fluid coolant source could be tapped into the existing air conditioning fluid loop or share a common heat-exchanger with the existing air conditioning fluid loop. In a vehicle the coolant could be pumped through the battery or fuel cell DC power source, through the motor drive electronics, through the motor windings and then back to the source. This could be achieved with pluggable connectors making servicing very simple.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A high power drive stack system comprising:
   a common support structure including:
      a system power source,
      a dielectric fluid cooling system, and
      a plurality of receivers located in predetermined locations,
      wherein at least one of the receivers has at least two receiver connectors and the at least two receiver connectors have a predetermined position in one of the receivers;
   at least one module including:
      a power component,
      a dielectric fluid cooling circuit associated with the power component, and
      at least two module connectors,
      wherein the at least two module connectors are arranged in a predetermined position and electrically coupled to at least a portion of the power component and fluidly coupled to the dielectric fluid cooling circuit associated with the power component; and
      each module connector mating with a corresponding receiver connector to form an electrical connection and a fluid connection between the module and the common support structure;
      wherein the dielectric fluid cooling system and the dielectric fluid cooling circuit utilize a vaporizable dielectric refrigerant; and
   wherein the dielectric fluid cooling system comprises a plurality of fluid conduits, a pump, a condenser, and an evaporator, the evaporator positioned on the at least one module.

2. The system of claim 1 further including a plurality of modules.

3. The system of claim 2, wherein the plurality of modules are stacked together and secured to the common support structure.

4. The system of claim 3, wherein the common support structure is a rack or cabinet.

5. The system of claim 1, wherein the electrical connection and the fluid connection formed by each module connector mating with a corresponding receiver connector is a dry-break connection.

6. The system of claim 5, wherein the electrical connection and the fluid connection formed by each module connector mating with a corresponding receiver connector is a non-latching connection.

7. The system of claim 1, wherein the module connectors and the receiver connectors form a plug and socket connection.

8. The system of claim 7, wherein each plug and socket connection is formed at least in part as a hollow tube, at least a portion of the tube being conductive along its length and the tubes providing a fluid passageway when the plug is inserted into the tube.

9. A high power drive stack system comprising:
a common support structure including:
    a system power source,
    a dielectric fluid cooling system, and
    a plurality of receivers located in predetermined locations,
    wherein at least one of the receivers has at least two receiver connectors and the at least two receiver connectors have a predetermined position in one of the receivers;
at least one module including:
    a power component,
    a dielectric fluid cooling circuit associated with the power component, and
    at least two module connectors,
    wherein the at least two module connectors are arranged in a predetermined position and electrically coupled to at least a portion of the power component and fluidly coupled to the dielectric fluid cooling circuit associated with the power component; and
    each module connector mating with a corresponding receiver connector to form an electrical connection and a fluid connection between the module and the common support structure;
wherein the module further comprises a cold plate operating at the potential of a power component bonded directly to the cold plate.

10. The system of claim 1, wherein at least portions of the module dielectric fluid cooling circuit associated with the power component are used as current carrying bus bars.

11. The system of claim 1, wherein the power component of the at least one module is a silicon disk or die.

12. A high power drive stack system comprising:
a common support structure including:
    a system power source,
    a dielectric fluid cooling system, and
    a plurality of receivers located in predetermined locations,
    wherein at least one of the receivers has at least two receiver connectors and the at least two receiver connectors have a predetermined position in one of the receivers,
at least one module including:
    a power component,
    a dielectric fluid cooling circuit associated with the power component, and
    at least two module connectors,
    wherein the at least two module connectors are arranged in a predetermined position and electrically coupled to at least a portion of the power component and fluidly coupled to the dielectric fluid cooling circuit associated with the power component; and
each module connector mating with a corresponding receiver connector to form an electrical connection and a fluid connection between the module and the common support structure;
wherein the power component of the at least one module is a silicon disk or die;
wherein the at least one module further comprises a heat sink on both sides of the silicon disk or die, wherein the module dielectric fluid cooling circuit passes through both the heat sinks, at least a portion of the module dielectric fluid cooling circuit also providing an electrical connection to the power silicon disk or die.

13. A high power drive stack system comprising:
a common support structure including:
    a system power source,
    a dielectric fluid cooling system, and
    a plurality of receivers located in predetermined locations,
    wherein at least one of the receivers has at least two receiver connectors and the at least two receiver connectors have a predetermined position in one of the receivers;
at least one module including:
    a power component
    a dielectric fluid cooling circuit associated with the power component, and
    at least two module connectors,
    wherein the at least two module connectors are arranged in a predetermined position and electrically coupled to at least a portion of the power component and fluidly coupled to the dielectric fluid cooling circuit associated with the power component; and
each module connector mating with a corresponding receiver connector to form an electrical connection and a fluid connection between the module and the common support structure;
wherein the power component of the at least one module is a silicon disk or die;
wherein a dielectric fluid of the module dielectric fluid cooling circuit is in direct contact with at least a portion of the silicon disk or die of the module, at least a portion of the module dielectric fluid cooling circuit also providing an electrical connection to the power silicon disk or die.

* * * * *